United States Patent

Wiedmann

[15] 3,676,713

[45] July 11, 1972

[54] SATURATION CONTROL SCHEME FOR TTL CIRCUIT

[72] Inventor: Siegfried K. Wiedmann, Poughkeepsie, N.Y.

[73] Assignee: International Business Machines Corporation, Armonk, N.Y.

[22] Filed: April 23, 1971

[21] Appl. No.: 136,700

[52] U.S. Cl. ....................307/300, 307/215, 307/303

[51] Int. Cl. ....................H03k 17/04

[58] Field of Search ....................307/215, 300, 299 A

[56] References Cited

UNITED STATES PATENTS

| | | | |
|---|---|---|---|
| 3,160,765 | 12/1964 | Krossa | 307/300 |
| 3,229,119 | 1/1966 | Bohn et al. | 307/229 A |
| 3,225,217 | 12/1965 | Corney | 307/300 |

OTHER PUBLICATIONS

" Logic Circuit" by L. W. Atwood, IBM Technical Disclosure Bulletin, Vol. 8, No. 2, 1965 (July) pp 317, 318

*Primary Examiner*—James W. Lawrence
*Assistant Examiner*—Harold A. Dixon
*Attorney*—Hanifin and Jancin and James E. Murray

[57] ABSTRACT

This specification discloses a technique of saturation control for a transistor transistor logic (TTL) circuit which is also applicable to other types of circuits. The saturation control device is a transistor whose emitter is connected to the collector of the output transistor of the TTL circuit, its collector is connected to the base of the output transistor for the TTL circuit and its base is connected through a resistive divider network between the base and collector of the input transistor for the TTL circuit. This saturation control transistor is formed in the same isolation pocket with the input transistor for the TTL circuit by providing the input transistor with an extended base region and an additional emitter diffusion which is spaced from the other emitter diffusions and the collector contact for the input transistor so that the sections of the extended base region between the additional emitter diffusion and the other emitter diffusions and between the additional emitter diffusion and the collector contact form the resistors of the divider network.

2 Claims, 3 Drawing Figures

INVENTOR
SIEGFRIED K. WIEDMANN

BY James E. Murray
ATTORNEY

SATURATION CONTROL SCHEME FOR TTL CIRCUIT

BACKGROUND OF THE INVENTION

This specification relates to logic circuits and more particularly to the prevention of transistor saturation in logic circuits.

Monolithic transistor transistor logic (TTL) circuits are widely used because they offer good trade-off between performance, power dissipation, functional density on the monolithic chip and logic flexibility. However, in TTL high drive currents are used to drive the output transistor to obtain a fast turn-on transition and this causes excessive charge to be stored in the heavily saturated output transistor resulting in a long turn-off delay. This turn-off delay has prevented the use of TTL circuits in some high speed applications.

To extend the operating range of TTL circuits a number of methods have been proposed to prevent deep saturation in the output trânsistor. The most useful of these proposed approaches utilizes a Schottky barrier diode in shunt with base collector junction of the output transistor to clamp the voltage across the base collector function at a relatively low forward voltage. The disadvantage of this technique is that additional process complexity in making the Schottky diodes when metals other than aluminum are used for the metallic interconnections and some noise problem due to the fact that the characteristics of transistors of the TTL circuit and those of the antisaturation Schottky diode do not track each other in the manner to transistors formed in the same monolithic chip.

In copending application, Ser. No. 136,699 filed on even date herewith and entitled "Antisaturation Technique for TTL Circuits" in the name of James R Winnard and assigned to the International Business Machines Corporation, another antisaturation technique is proposed. This technique involves the use of an additional emitter diffusion in the input transistor of the TTL circuit which is coupled to the collector of the output transistor of the TTL circuit. This connection then shunts base drive current for the output transistor by the base collector junction of the output transistor when the voltage at the collector of the output transistor drops sufficiently to forward bias the emitter base junction of the connected emitter. This technique overcomes the metalization problem involved in using the Schottky barrier diodes and takes advantage of tracking in the characteristics of transistors formed on the same chip. However, it does have the disadvantage of insufficient control over the voltage level at which drive current is shunted by the output transistor resulting in noise problems in some applications.

BRIEF DESCRIPTION OF THE INVENTION

Therefore, in accordance with the present invention a new antisaturation technique for TTL circuits is provided which does not have the disadvantages mentioned above. In this new technique a transistor is used as the antisaturation device. The emitter of this antisaturation transistor is connected to the collector of the output transistor for the TTL circuit and the collector of this antisaturation transistor is connected to the base of the output transistor for the TTL circuit while the base of the antisaturation transistor is connected through a resistive divider network to the base and collector of the input transistor for the TTL circuit. This saturation control transistor and the resistive divider network are formed in the same isolation pocket with the input transistor for the TTL circuit by providing the input transistor with an extended base region and an additional emitter diffusion which is spaced from the other transistor emitter diffusions and from the collector contact for the input transistor so that the sections of the extended base region between the additional emitter diffusion and the other emitter diffusions and between the additional emitter diffusion and the collector contact form the resistors of the divider network.

Therefore, it is an object of the present invention to limit saturation in circuits.

It is another object of the present invention to limit saturation in TTL circuits.

Another object of the present invention is to prevent saturation in TTL circuits using the techniques that are compatible with the fabrication of the transistors in the TTL circuit, which permits control over the potential at which the antisaturation transistor operates and which requires very little chip real estate.

DESCRIPTION OF THE DRAWINGS

These and other objects, features and advantages of the invention will be apparent from the following more particular description of the preferred embodiments of the invention as illustrated in the accompanying drawings, of which:

FIG. 1 shows a conventional TTL circuit which, in accordance with the present invention, has been supplemented with a feedback transistor $T_0$ to provide a saturation control for the output transistor $T_1$. With any one or more of the three inputs A, B or C down the emitters $e_1$, $e_2$ or $e_3$ coupled to the down inputs are forward biased. For instance, assume the input B is at a down level and the inputs A and C are at up levels so that emitter $e_2$ is forward biased and emitters $e_1$ and $e_3$ are back biased. Then the current $I_{R2}$ flowing through resistor $R_2$ flows out the input B through the base emitter $e_2$ junction of transistor $T_2$. This prevents the current $I_{R2}$ from reaching the base of transistor $T_1$ through the base collector junction of transistor $T_2$ so that transistor $T_1$ remains biased off and the output voltage $V_0$ is at an up level. However, when all the inputs A, B and C are at an up level the emitters $e_1$ to $e_3$ of transistor $T_2$ are back biased so that current then flows to the base of transistor $T_1$ turning transistor $T_1$ on and dropping the voltage at the output $e_0$. Without feedback transistor $T_0$ the output transistor $T_1$ becomes heavily saturated due to excessive base current supplied through resistor $R_2$ to provide fast turn-on transistors for transistor $T_1$. When this occurs, and when one of the inputs A to C is thereafter dropped to a down level, it takes time for transistor $T_1$ to recover and turn off thus slowing the response time of the circuit. With the present invention this problem is overcome by the addition of resistor $R_3$ and transistor $T_0$. The ratio of the two portions $R_{32}$ and $R_{31}$ of resistor $R_3$ is chosen so that the base potential of transistor $T_0$ is typically 100 millivolts higher than the base-emitter voltage of transistor $T_1$ when transistor $T_1$ is in the on state. By doing this the turn-on time of transistor $T_1$ is not noticeably effected since being so biased transistor $T_0$ will not conduct any appreciable current so long as the output $V_0$ is higher than 200 millivolts. However, as soon as the output $V_0$ drops below 200 millivolts transistor $T_0$ will conduct causing the base drive current $I_{R2}$ from resistor $R_2$ to flow through the collector to the emitter path of transistor $T_0$ and thereby shunt transistor $T_1$. Therefore, transistor $T_1$ is not driven into saturation by the drive current and recovers rapidly when any one of the inputs A, B or C is lowered.

Figure 1:
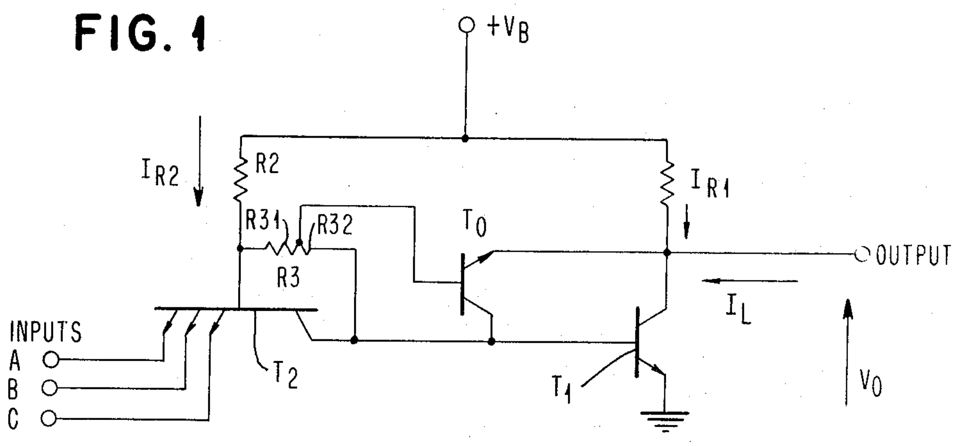
FIG. 1 is a schematic of a TTL circuit embodying the present invention.
Figure 2:
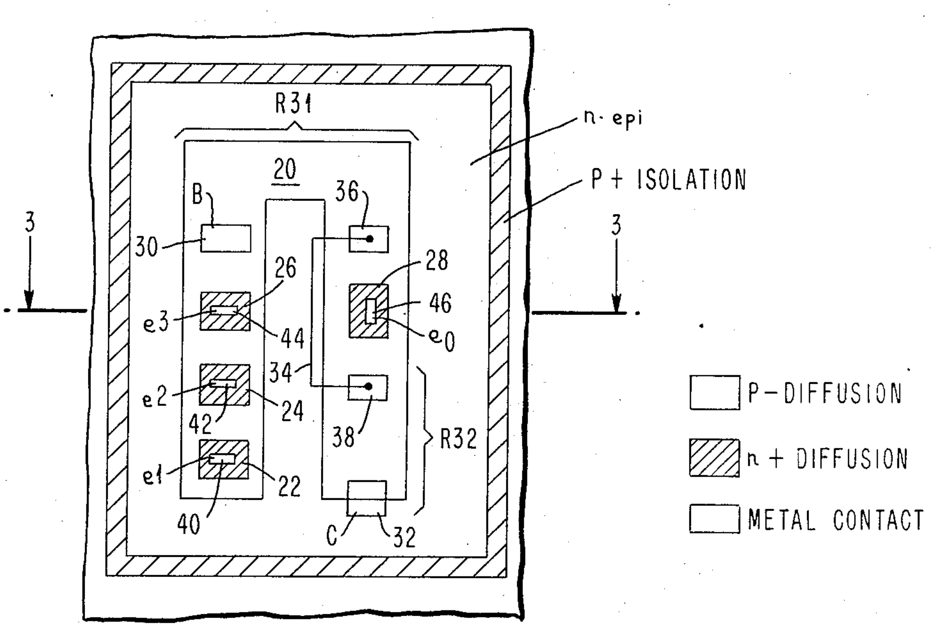
FIG. 2 is a plan view of a monolithic layout of the input transistor and the antisaturation transistor for the circuit of FIG. 1.
Figure 3:
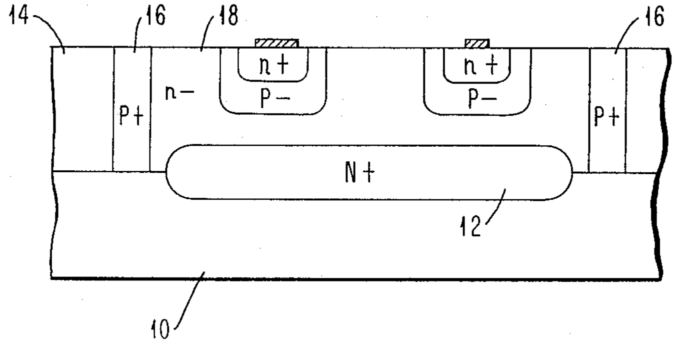
FIG. 3 is a section along lines 3—3 in FIG. 2.

The layout on a monolithic chip for transistor $T_2$, transistor $T_0$ and resistor $R_3$ can be performed in one isolation zone as shown in FIGS. 2 and 3. An N+ subcollector diffusion 12 is placed into a P substrate 10 and an N epitaxial layer 14 is then grown thereover. A P+ isolation diffusion 16 is thereafter placed around the subcollector 12 to define a rectangular area as shown. The N− epi 18 within this area serves as the collector for both the input transistor $T_1$ and the saturation control transistor $T_0$. A U shape P− diffusion 20 is made within this area to serve as the base for both transistors $T_1$ and $T_0$ and as the resistances $R_{31}$ and $R_{32}$. Four N+ diffusions 22–28 are then made into the base to serve as the emitter diffusions for transistors $T_1$ and $T_2$. As can be seen, the diffusions 22 to 26 for the emitters $e_1$ to $e_3$ of transistor $T_1$ are located at the end of one arm of the U while the diffusion 28 for the emitter $e_0$ of transistor $T_0$ is located in the middle of the other arm of the U. Metalization is thereafter provided to make contact to the diffusions to complete the transistors. It will be noted that the base contact 30 for transistor $T_1$ is placed adjacent the emitter diffusions 22–26 for transistor $T_1$ while the collector contact for both the transistors is made to the collector and to the arm of the U shaped base containing the emitter 28 for transistor $T_0$. A metallic short 34 is placed on the base around the emitter $e_0$. By doing this, the portion of the base diffusions 20 between the base contact 30 and the short contact 36 serves as the resistor $R_{31}$ while the portion of U shaped diffusion between the short contact 38 and collector 32 serves as the resistor $R_{32}$. Contacts 40–46 are the emitter contacts of both transistors. The layout on a monolithic chip for transistor $T_1$, resistor $R_1$ and resistor $R_2$ are in separate isolation areas formed in the usual manner. These layouts are not new, do not constitute a portion of the present invention and, therefore, are not shown here.

It can be seen then that the additional saturation control elements for the TTL circuit are bought at the cost of very cheap real estate since they, the saturation control elements, are formed in the same diffusion as the multi-emitter input transistor $T_1$. Furthermore, the circuit, as the circuit of copending application, serial number filed on even date herewith, avoids the fabrication and element tracking problems attendant with the Schottky barrier saturation prevention technique. In addition, the present approach eliminates the difficulties associated with the approach covered in the copending application by providing a transistor $T_0$ whose operation can be controlled very accuratly to give a clipping potential at the collector of transistor $T_1$ which eliminates the noise problems discussed previously.

It should be understood that while the invention is shown as being applied to a TTL circuit portions of the invention can also be used with other circuits such as cross-connected multivibrator circuits and linear amplifiers to prevent saturation in a given transistor. What is necessary to operate the invention in such diverse circuits is that the emitter of the antisaturation transistor be connected to the collector of a given transistor, its collector to the base of the given transistor and that some means be provided between the collector and base of the antisaturation transistor to control the operating level of the antisaturation transistor.

Therefore, while the invention has been shown and described with respect to preferred embodiments thereof, it will be understood by those skilled in the art that various changes in form and detail may be made therein without departing from the spirit and scope of the invention.

What is claimed is:

1. A transistor circuit which does not go into deep saturation comprising:

a driver transistor arranged in a common emitter configuration so that the base of the transistor receives drive current and an output is taken off the collector;

drive means coupled to the base of the driven transistor for supplying drive current to said base of the driven transistor, said drive means comprising a multi-emitter transistor with a collector connected to the base of the driven transistor, and emitters serving as individual inputs for the circuit, and a current source coupled to the base of the multi-emitter transistor so that said circuit serves as an AND gate;

an antisaturation transistor with an emitter coupled to the collector of the driven transistor and a collector coupled to the base of the driven transistor; and a resistive divider network coupled between the base of the multi-emitter transistor and the collector and having a portion thereof coupled between the base and collector of said antisaturation transistor to form a biasing means for biasing the base of the antisaturation transistor at a potential greater than the emitter base voltage of the driven transistor when the driven transistor is conducting, wherein said potential is large enough to prevent the operation of the antisaturation transistor from significantly effecting the turn-on time of the first transistor but small enough to allow the antisaturation transistor to be turned on when the collector of the driven transistor starts to drop as the driven transistor tends to go into saturation whereby the antisaturation transistor conducts and shunts base drive current by the driven transistor and thereby prevents the driven transistor from going into saturation.

2. The circuit of claim 1 wherein said multi-emitter transistor and the antisaturation transistor share common collector and base regions and wherein said base region is elongated, has mounted thereon a base contact for the said multi-emitter and antisaturation transistors, and a contact to the collector of said multi-emitter and antisaturation transistors and contains between the base and collector contacts an emitter diffusion for the antisaturation transistor so that the resistors of the resistive divider network are formed integrally in the base region of said two transistors.

* * * * *